United States Patent
Abouelenin

(10) Patent No.: US 10,892,787 B2
(45) Date of Patent: Jan. 12, 2021

(54) LOAD MODULATION IN SIGNAL TRANSMISSION

(71) Applicant: Airbus Defence and Space Limited, Stevenage, Hertfordshire (GB)

(72) Inventor: Ahmed Abouelenin, Surrey (GB)

(73) Assignee: Airbus Defence and Space Limited, Hertfordshire (GB)

( * ) Notice: Subject to any disclaimer, the term of this patent is extended or adjusted under 35 U.S.C. 154(b) by 0 days.

(21) Appl. No.: 16/325,776

(22) PCT Filed: Aug. 11, 2017

(86) PCT No.: PCT/GB2017/052381
§ 371 (c)(1),
(2) Date: Feb. 15, 2019

(87) PCT Pub. No.: WO2018/033711
PCT Pub. Date: Feb. 22, 2018

(65) Prior Publication Data
US 2019/0215023 A1 Jul. 11, 2019

(30) Foreign Application Priority Data
Aug. 15, 2016 (GB) .................................. 1613948.7

(51) Int. Cl.
*H04B 1/04* (2006.01)
*H03F 1/32* (2006.01)
(Continued)

(52) U.S. Cl.
CPC ......... *H04B 1/0475* (2013.01); *H03F 1/0222* (2013.01); *H03F 1/0233* (2013.01);
(Continued)

(58) Field of Classification Search
USPC ........................................ 375/297; 330/289
See application file for complete search history.

(56) References Cited

U.S. PATENT DOCUMENTS 7,151,411 B2  12/2006  Martin et al.
9,167,514 B2 * 10/2015  Dakshinamurthy ........................
H04W 52/0209
(Continued)

FOREIGN PATENT DOCUMENTS

WO  2015019091 A1  2/2015
WO  2016077257 A1  5/2016

OTHER PUBLICATIONS

International Search Report and Written Opinion issued in corresponding International Patent Application No. PCT/GB2017/052381, 17 pages (dated Oct. 26, 2017).

*Primary Examiner* — Eva Y Puente
(74) *Attorney, Agent, or Firm* — Buchanan Ingersoll & Rooney PC

(57) ABSTRACT

A transmitter for transmitting a signal is provided, in which the transmitter includes a power amplifier and a driver amplifier, an output of the driver amplifier being connected to an input of the power amplifier via a first load modulation device operable to match the impedance of the driver amplifier output with impedance of the power amplifier input. A second load modulation device can be connected to the output of the power amplifier and operable to match the impedance of the power amplifier output with input impedance of a further device. Envelope tracking can be applied to the power amplifier and the driving amplifier.

13 Claims, 9 Drawing Sheets

(51) Int. Cl.
*H03F 1/56* (2006.01)
*H03F 1/02* (2006.01)
*H03F 3/24* (2006.01)
*H04L 27/04* (2006.01)

(52) U.S. Cl.
CPC ............ *H03F 1/3241* (2013.01); *H03F 1/56* (2013.01); *H03F 3/24* (2013.01); *H03F 3/245* (2013.01); *H04B 1/0458* (2013.01); *H04L 27/04* (2013.01); *H03F 1/3247* (2013.01); *H03F 2200/102* (2013.01); *H03F 2200/318* (2013.01); *H03F 2200/378* (2013.01); *H03F 2200/411* (2013.01); *H03F 2200/451* (2013.01); *H04B 2001/0408* (2013.01); *H04B 2001/0425* (2013.01)

(56) References Cited

U.S. PATENT DOCUMENTS

| | | | |
|---|---|---|---|
| 9,729,110 B2 * | 8/2017 | Geng | H03F 1/3241 |
| 2017/0126258 A1 * | 5/2017 | Subrahmaniyan Radhakrishnan | H04B 1/0475 |
| 2017/0207752 A1 * | 7/2017 | Lehtola | H03F 1/0283 |
| 2018/0026583 A1 * | 1/2018 | Yanduru | H03F 1/0288 330/289 |
| 2018/0034416 A1 * | 2/2018 | Duncan | H03F 1/0216 |

* cited by examiner

LOAD MODULATION IN SIGNAL TRANSMISSION

TECHNICAL FIELD

The present invention relates to transmitters and signal transmission systems and methods of transmitting signals using load modulation. An exemplary application of the invention is in satellite transmission systems.

BACKGROUND ART

In satellite communications, there is an increasing demand to support higher data throughput. In communication payloads, DC-to-RF power conversion efficiency is an important consideration and most of the DC power is consumed by the RF Power Amplifier (PA). The maximization of PA efficiency while maintaining low signal distortion is desirable.

Signal transmission systems are known generally that include a base station to emit a signal and a relay station remote from the base station to relay the original signal further than would be possible with the base station alone. For example, this arrangement is often used in terrestrial mobile telecommunication systems. The arrangement is also used in satellite communications, where the relay station typically comprises a satellite in orbit around the Earth.

There is increasing requirement to send large volumes of data as quickly as possible and bandwidth is necessarily restricted to pre-allocated channels. Further, there is a desire to increase the efficiency of signal transmission systems, especially on board satellites where the power supply is often restricted.

In order to increase the signal strength emitted by a power amplifier, one option is to simply increase the power at which they are operated. When power amplifiers are operated in the upper part of their range, their behaviour is non-linear.

SUMMARY OF INVENTION

According to a first aspect of the invention, we provide a transmitter for transmitting a signal comprising a power amplifier and a driver amplifier, an output of the driver amplifier being connected to an input of the power amplifier via a first load modulation device operable to match the impedance of the driver amplifier output with the impedance of the power amplifier input, further comprising a second load modulation device connected to the output of the power amplifier and operable to match the impedance of the power amplifier output with the input impedance of a further device.

Advantageously, the use of load modulation allows efficient flow of power through the system. Further advantages include that the simple design (i.e. depends on the output voltage swing and required capacitance range), adds a very little complexity to the system in terms of weight, volume, and cost compared.

The first and second load modulation devices can comprise matching networks comprising one or more varactors. The further device can comprise an antenna for example.

The transmitter can further include predistortion means operable to apply predistortion to the signal to compensate for non-linearity of the driver amplifier and the power amplifier and the load modulation devices.

Both power efficiency and bandwidth efficiency can advantageously be increased by employing digital pre-distortion (DPD). The combined effect of load modulation and digital predistortion arranged to correct any non-linearity caused by the load modulation leads to a particularly efficient transmitter that can produce a well-defined signal.

The predistortion means can comprise a first predistortion means to compensate for non-linearity of the power amplifier and the second load modulation device. Further, the predistortion means can comprise a second predistortion means operable to apply predistortion to compensate for non-linearity of the driver amplifier and the first load modulation device.

The first predistortion means can be connected to the second load modulation device and arranged to provide a control signal thereto. The second predistortion means can be connected to the first load modulation device and arranged to provide a control signal thereto.

The control signals can comprise feedforward control signals.

The transmitter can be disposed in a base station or a relay station, such as a satellite. The transmitter may further comprise a switch operable to bypass the power amplifier. In cases of low power output requirement, the signal can then be amplified using only the driver amplifier, which is more efficient than using both amplifiers.

The transmitter may comprise means for applying envelope tracking to the power amplifier and the driving amplifier. The transmitter may comprise a power supply 103 for each of the driver amplifier and the power amplifier and power modulation means 102 arranged to modulate power supplied to each of the driver amplifier and the power amplifier. The transmitter may also be provided with delay means arranged such that the power modulation applied to the power amplifier is applied to the driver amplifier after a delay.

According to a second aspect of the invention, we provide a method of transmitting a signal with a transmitter according to the first aspect of the invention, comprising applying predistortion to a signal and amplifying the signal using one or more amplifiers, and modulating the load at the output of the or each amplifier to substantially match the impedance of the load with that of the output, controlling the load modulation via the predistortion means.

BRIEF DESCRIPTION OF DRAWINGS

There follows a detailed description of embodiments of the invention by way of example only and with reference to the accompanying drawings, in which.

DESCRIPTION OF PREFERRED EMBODIMENTS

Figure 1:
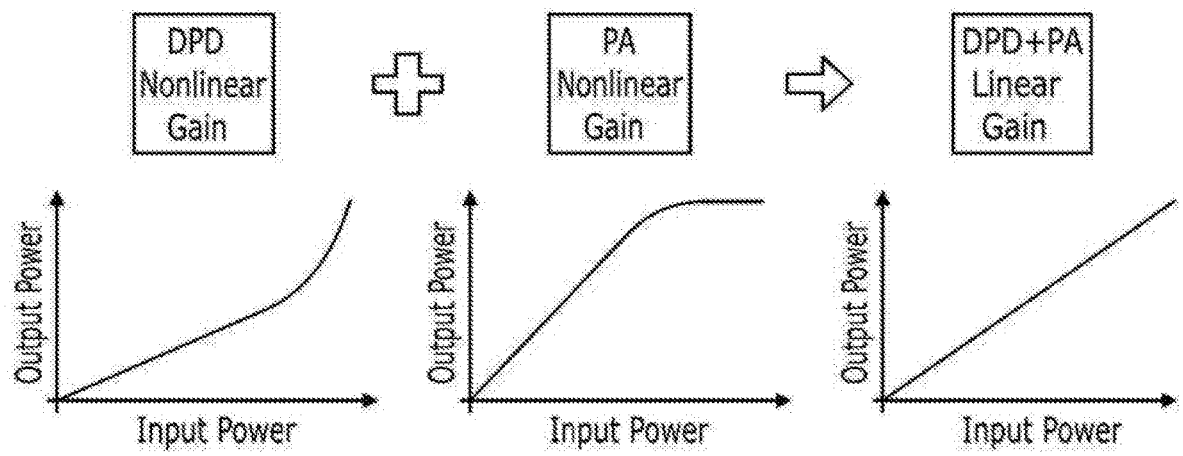
FIG. 1 is a schematic representation of the effects of digital pre-distortion.

By way of further background explanation of the principles behind the invention, FIG. 1 includes three schematic graphs showing how the DPD can offset the non-linearity of the PA. The DPD has a linearization effect on the PA output. In small fractional bandwidth systems, it is not feasible to filter out out-of-band spectral regrowth due to the required high-Q filter. PA DPD-based linearization is achieved by digitally processing in-phase (I) and quadrature (Q) baseband data so that frequency components are generated within a bandwidth equal to that of the spectral regrowth (normally 5 times the modulated signal bandwidth) to compensate for the distortion due to PA nonlinearities. Thus, a wideband transmitter should be used. This digital "preprocessing" allows the PA to be operated up to saturation point and mitigates the in-band and out-of-band distortions due to nonlinear behaviour. Hence, output power back-off can be significantly reduced.

Figure 2:
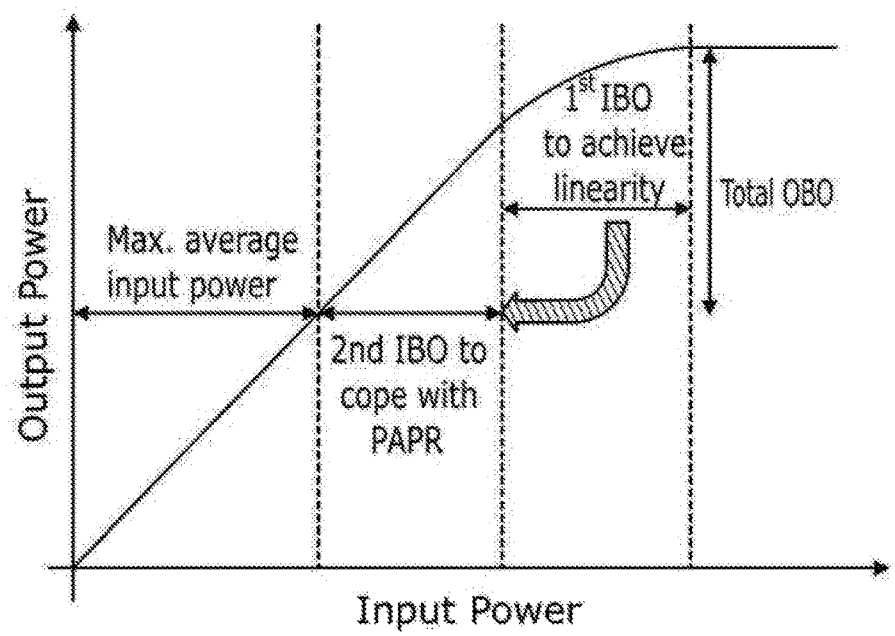
FIG. 2 is a graph showing input vs output power for a typical amplifier.

As shown in FIG. 2, power back-off techniques can also be used to help achieve linearity in the output of the PA and to cope with signals having a high peak to average power ratio. To maintain linear amplification for high PAPR signals using linear PAs, two power back-offs can be utilised; the first to avoid the nonlinear part of the gain curve and the second which is to deal with the PAPR. Even if DPD is used to alleviate the 1st back-off, either supply or load modulation could only mitigate the 2nd back-off to achieve acceptable overall power added efficiency (PAE).

Figure 5:
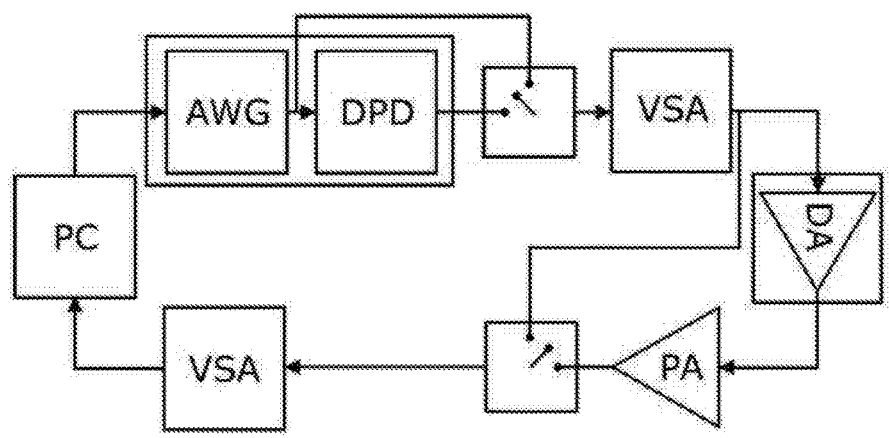
FIG. 5 is a schematic representation of a system for testing a DPD device.

FIG. 5 shows a block diagram for a typical DPD+PA hardware test setup. This setup is for implementing a method of modelling the response of a transmission system that utilises DPD using a model coefficient extraction procedure. I and Q data of a test signal can be generated on a PC using Matlab then downloaded on an arbitrary waveform generator (AWG). These data modulate an RF carrier in a Vector Signal Generator (VSG) where signal upconversion is achieved. The modulated RF carrier feeds the PA and a driver amplifier (DA) may be used for high power PAs (HPA). A Vector Signal Analyzer (VSA) downconverts then demodulates the RF modulated carrier. This allows extraction of the DPD model coefficients (in the PC) by comparing the demodulated I and Q data of the original (PA is removed) and distorted signal (i.e. signal as amplified by the PA). The DPD+PA performance can be verified by downloading the predistorter I and Q data on the AWG and measuring the PA output.

Future high throughput satellites, where a large fractional bandwidth is expected, could benefit from adopting bandlimited-DPD. These benefits, compared to using a conventional DPD, could be: less hardware complexity and less processing power as a result of processing a bandwidth comparable to the original modulated signal bandwidth compared to 5 times bandwidth in conventional DPD.

Figure 3:
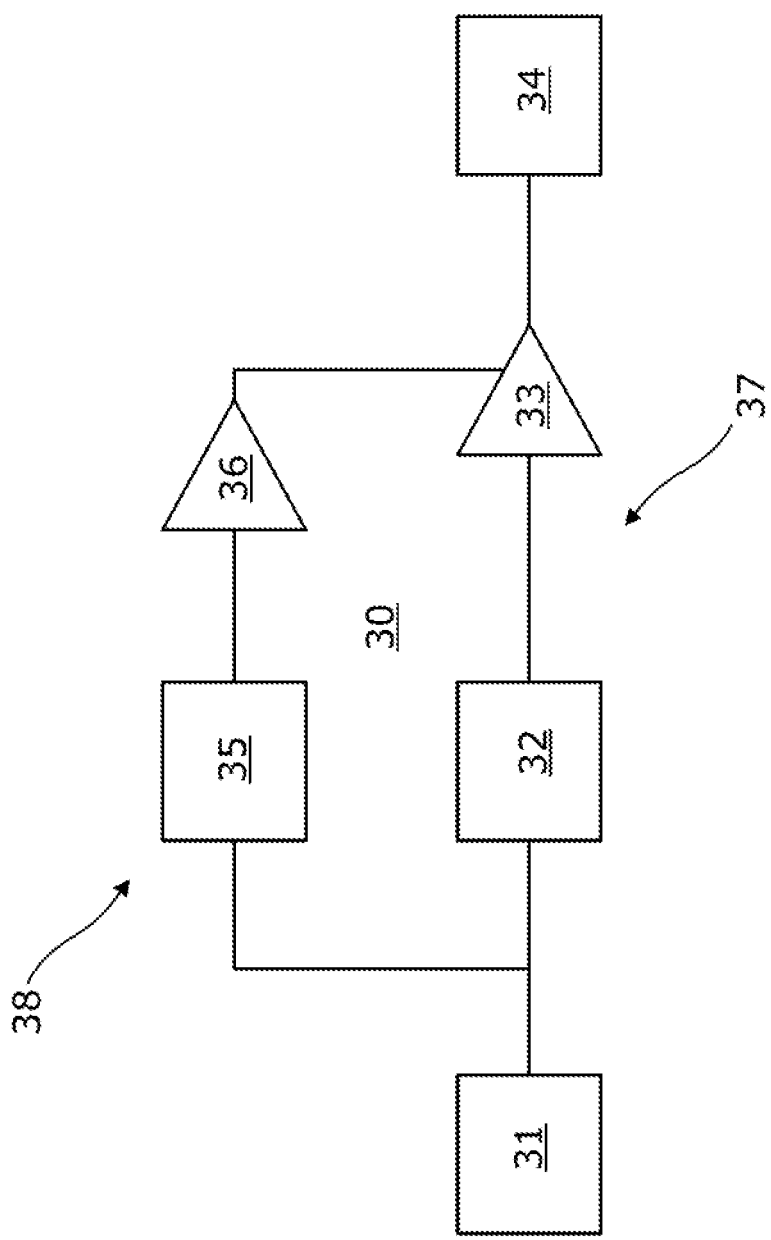
FIG. 3 is a schematic representation of a signal transmission system including digital predistortion means.

FIG. 3 shows a first embodiment of the signal transmission system 30. The system 30 comprises means 31 for producing a signal that is desired to be transmitted by a satellite, e.g. a film or television program, and a means 34 for transmitting an amplified output signal, such as an antenna 34. A first channel 37 or electrical path of the system leads from the signal production means 31 to the antenna 34, via a first digital pre-distortion device 32 and an amplifier 33 to the antenna 34. The first digital pre-distortion device 32 produces a non-linearity in the signal that cancels out the non-linearity produced by the amplifier 33. A second channel 38 or electrical path is able to isolate an envelope of the signal. The second channel includes a second digital pre-distortion device 35 which is connected to an envelope amplifier for amplifying the envelope signal. The second digital pre-distortion device 35 applies a non-linearity to the envelope signal that is cancelled out by the non-linearity of the envelope amplifier.

Figure 4:
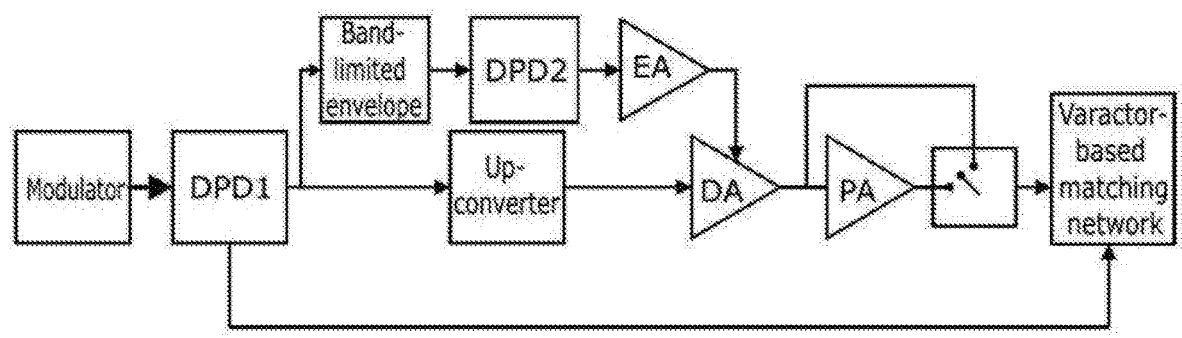
FIG. 4 is a schematic representation of a system including two digital predistortion means.

FIG. 4 shows a more detailed version of the embodiment of the invention shown in FIG. 3. The varactor-based matching network is modulating the output matching network based on the input modulated signal. The DPD+PA architecture shown in FIG. 3 advantageously increases the overall average power added efficiency of the system while minimizing the distortion in the driver amplifier (DA) stage. Load modulation is applied at the PA output using a varactors-based matching network where varactors can be placed in parallel to cope with high PA output power. The matching network can also be connected to an antenna for transmitting the output amplified signal. The bandwidth through path DPD1, upconverter, DA, and PA is limited to the original modulated signal bandwidth. Envelope tracking is applied to the driver amplifier using an envelope amplifier (EA) with additional DPD block (DPD2) to compensate for nonlinearities at EA output. Switching between the DA and PA is possible for low input power which further improves the average power added efficiency.

Figure 6:
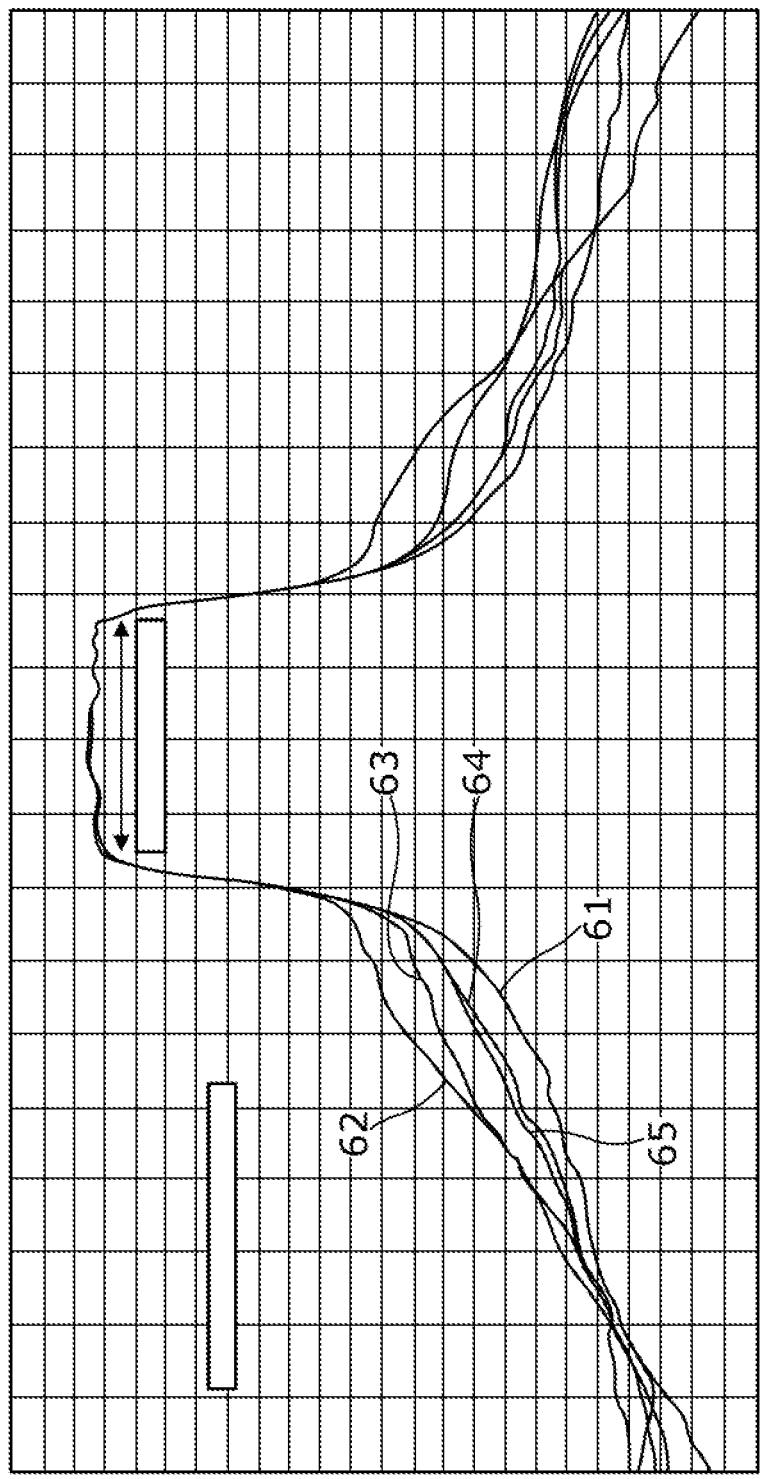
FIGS. 6 to 9 show spectra produced by systems utilising digital predistortion.

FIG. 6 shows a spectrum produced by a DPD modelling process, in particular, a NARMA-based (non-linear autoregressive moving average) DPD model for 1 GHz 1024-QAM ultra wideband signal modulated on a 4 GHz carrier using MGA-545P8 PA model on Agilent ADS® software. Three iterations are done to attain further adjacent channel power ratio (ACPR) improvement. FIG. 6 shows the original signal spectrum (61), PA distorted output (62), and DPD+PA output for the three iteration (63, 64 and 65). The vertical and horizontal axes are set to 0 to −110 dBm and 1 to 7 GHz, respectively. Approximately 12 dB improvement in ACPR is achieved while −23 dB NMSE is maintained.

Figure 7:
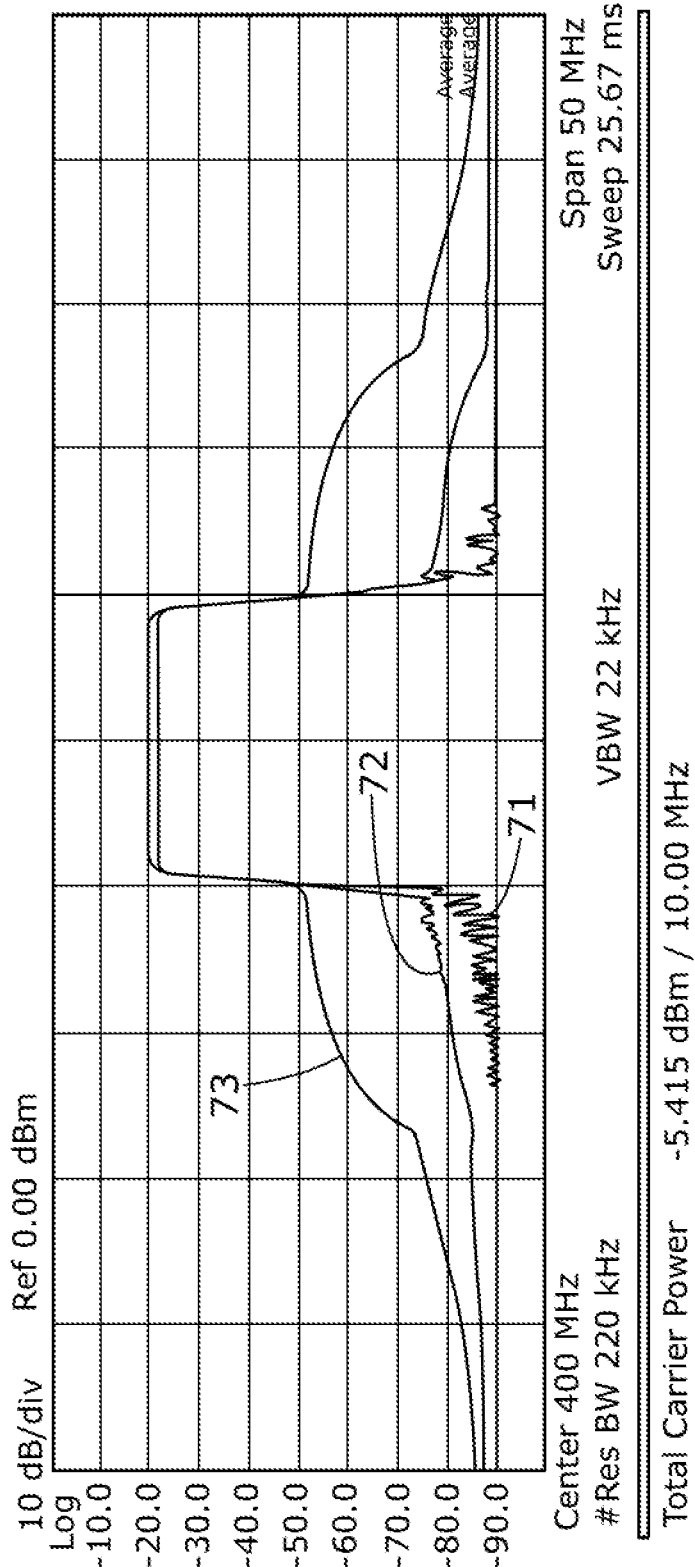
Figure 8:
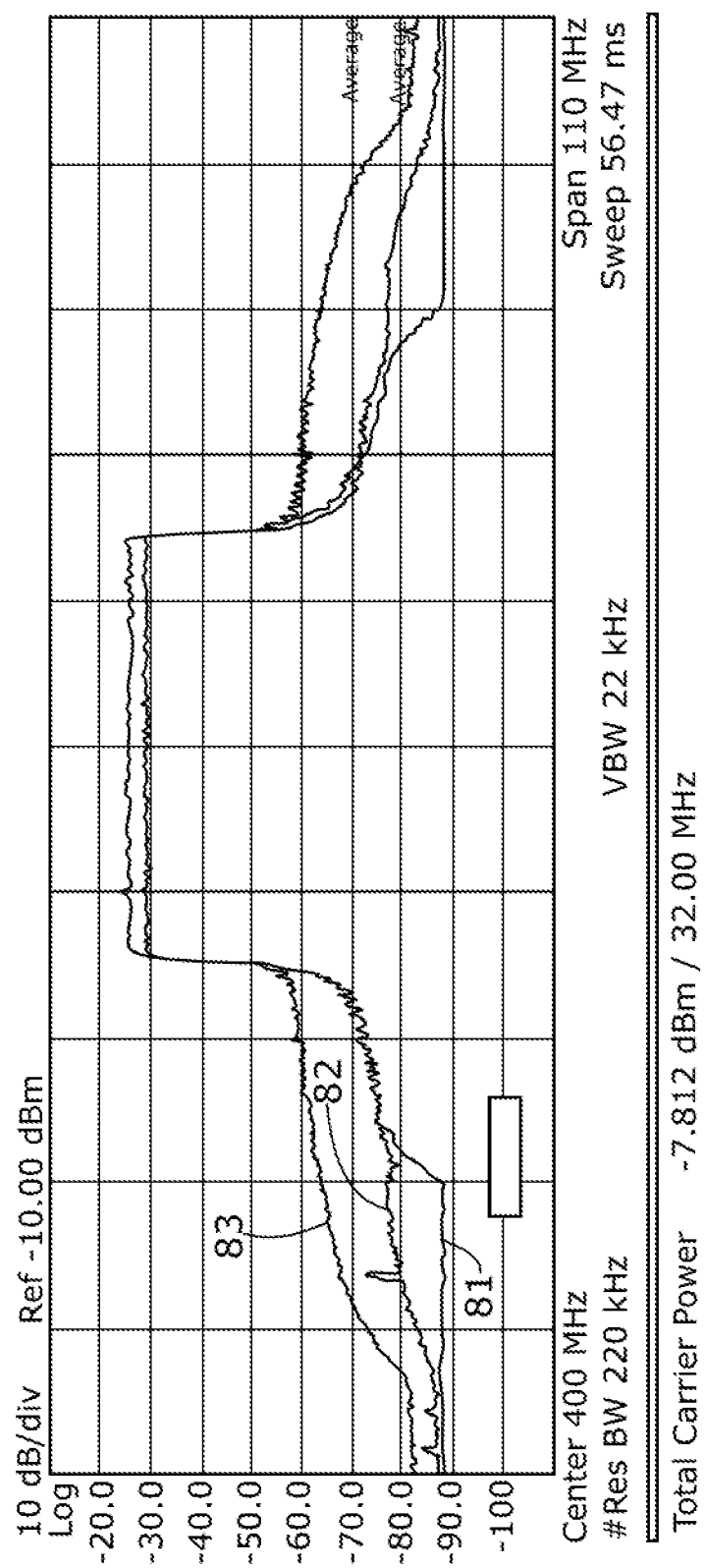
Figure 9:
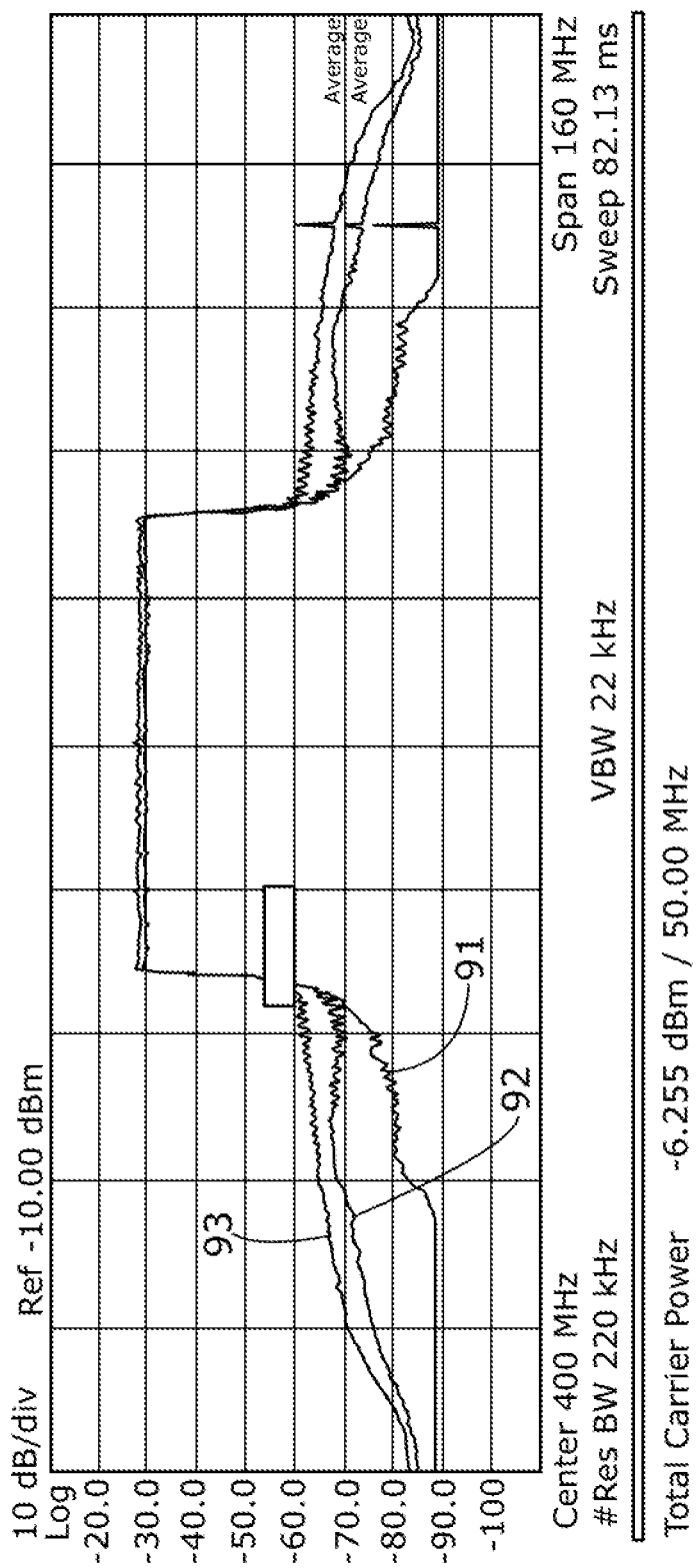

FIGS. 7 to 9 show spectra produced in a test setup as follows: A demonstration low noise amplifier (ZFL-500LN+ Mini-Circuits®) was used to demonstrate the effect of band limited DPD on the DPD+PA performance. The following equipment was used: Agilent® N5182B MXG RF Vector Signal Generator (VSG), Agilent® N9030A PXA Vector Signal Analyser (VSA), and a TTi EL302Tv triple power supply. The VSG and VSA are connected through a network switch for control and data exchange via a PC. Synchronization is established by connecting a to MHz reference, trigger, and event ports. FIG. 7 to FIG. 9 show the measured spectra of original signal, distorted PA output, and NARMA based DPD+PA for three different modulated test signals:

FIG. 7: 10 MHz LTE DL (QPSK)
FIG. 8: 32 MHz 1024-QAM
FIG. 9: 50 MHz 1024-QAM

The spectra shown in FIGS. 7 to 9 are each normalised to the level of the original signal to facilitate comparison of the signals. In FIG. 7, line 71 represents the original signal, line 73 represents the amplified signal without DPD, and line 72 represents the signal as amplified and pre-distorted. In FIG. 8, line 81 represents the original signal, line 83 represents the amplified signal without DPD, and line 82 represents the signal as amplified and pre-distorted. In FIG. 9, line 91 represents the original signal, line 93 represents the amplified signal without DPD, and line 92 represents the signal as amplified and pre-distorted.

The adjacent channel power ratio (ACPR) and normalised mean square error (NMSE) for DPD+PA were measured for each modulated signal and are summarized in Table 1. It is to be noted that a good NMSE could be achieved in all cases while a good ACPR is achieved only for the to MHz BW signal. This is justified as follows; due to the limited analysis bandwidth at the PA output, i.e. 60 MHz, no sufficient information about the spectral regrowth arrives to the DPD. Thus, the ACPR gets worse as the signal bandwidth becomes larger. However, DPD still copes with the in-band distortion.

TABLE 1

Measured ACPR and NMSE for DPD + PA

|  | ACPR (dB) | NMSE (dB) |
| --- | --- | --- |
| 10 MHz LTE DL | −25 | −36 |
| 32 MHz 1024 QAM | −10 | −33.54 |
| 50 MHz 1024 QAM | −4 | −33.52 |

The data thus indicate a most optimal performance for the 10 MHz LTE DL signal

Spectral re-growth can be filtered out for large fractional bandwidth signals (e.g. in L-Band) and for this reason, the ACPR constraint is significantly relaxed. To allow reliable reception of the transmitted signal over a satellite communication link a link budget-determined ratio of the signal energy over the spectral noise density, i.e. Es/No, has to be maintained at the receiver side assuming perfect signal transmission. EVM at the transmitter side decreases this ratio and has to be kept at minimum by employing DPD.

As a result of the heritage in space technology, nonlinear (switch) PAs, although power efficient, are not commonly used whereas linear PAs (power inefficient) are used. Thus high spectral density modulation techniques are avoided. An advantage of the present invention is that using DPD plus load and supply modulation on space (and ground) segments guarantees efficient usage of power. Moreover, a greater amount of data can be pushed into the link assuming the same power budget for a transmitter.

The figure of merit for the proposed DPD+PA should be achieving a lower EVM and high throughput with fixing the power consumption.

It is possible to use a training sequence to update the DPD model: in X-band payloads, the transmitter is on for a short period of time to transfer data when the satellite is in the visibility zone of the station. However, this does not necessarily happen for each orbit. Consequently, one of the orbits can be freed to transmit a training sequence to the data reception station. This received data could be compared, offline, to the ideal training sequence and an update for the DPD model coefficient could be extracted. This updated coefficient could be transmitted to the satellite through the TT&C transponder and used to configure the DPD model onboard. In other words, an offline adaptation could be made to cope with any unexpected very slow time variation of the PA.

DPD techniques for terrestrial communications as proposed in the present invention advantageously maximize the overall PAE while high PAPR signals can be used. A further advantage of embodiments of the present invention is that it allows less expensive (in terms of volume, mass, and cost) space and ground segment transmitters.

Figure 10:
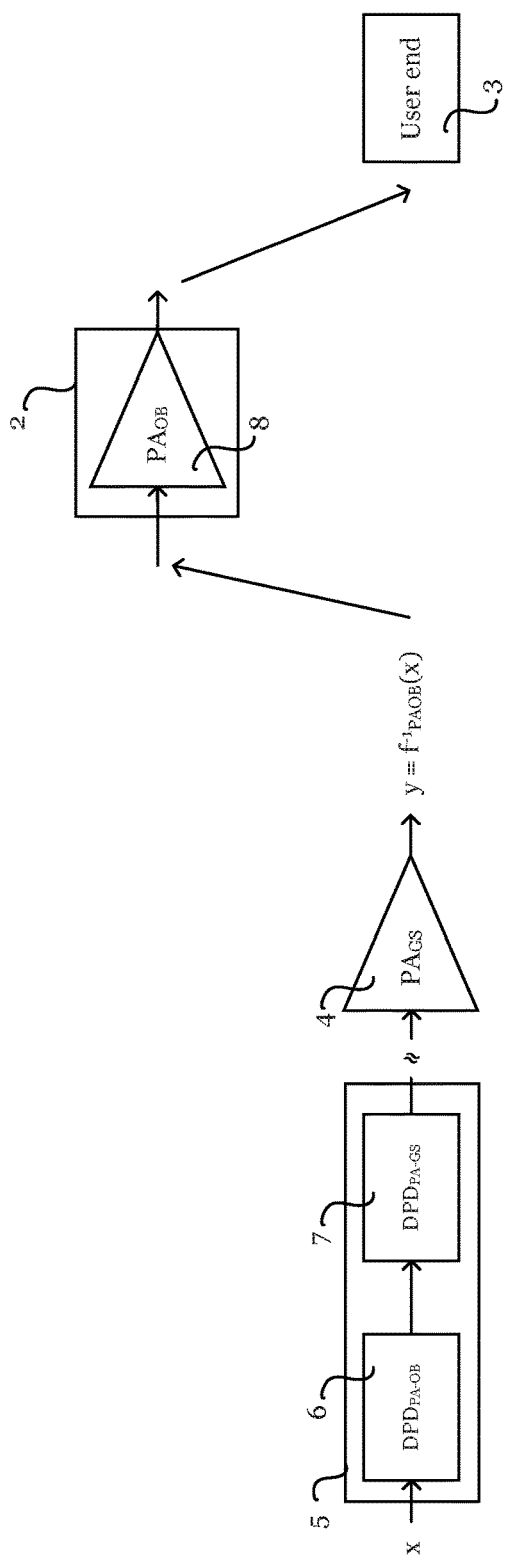
FIG. 10 shows schematically a signal transmission system including digital predistortion means.

FIG. 10 shows a signal transmission system in accordance with a third aspect of the invention comprising a base station 1 and a relay station 2. An end user 3 receives signals from the system, using for example a telephone or a television, or any other suitable receiving device. The base station 1 comprises a base power amplifier (PA) 4 which amplifies a signal "x" to be transmitted. The signal x is transmitted by an antenna (not shown) to the relay station 2, which in the present embodiment is on board a satellite. The relay station 2 comprises a relay PA 8, for amplifying the signal as it is relayed.

The base station 1 includes a digital pre-distortion means 5 which applies pre-distortion to the signal x to compensate for the non-linearity of the power output by the PA 4. The pre-distortion means 5 also applies pre-distortion to signal x to compensate for the non-linearity of the power output by the relay PA 8.

The digital pre-distortion means 5 comprises first and second digital pre-distortion devices 6 and 7. The first pre-distortion device 6 applies pre-distortion to the signal x, to compensate for the non-linearity of the relay PA 8 at the relay station 2. Where the relay station is a satellite, the relay PA 8 is typically part of a satellite transponder system. The second pre-distortion device 7 pre-distorts the signal x to compensate for the non-linearity of the base PA 4.

Each pre-distortion device 6, 7 has a response characteristic that is the inverse function of the response characteristics or gain curve of the PA.

Figure 11:
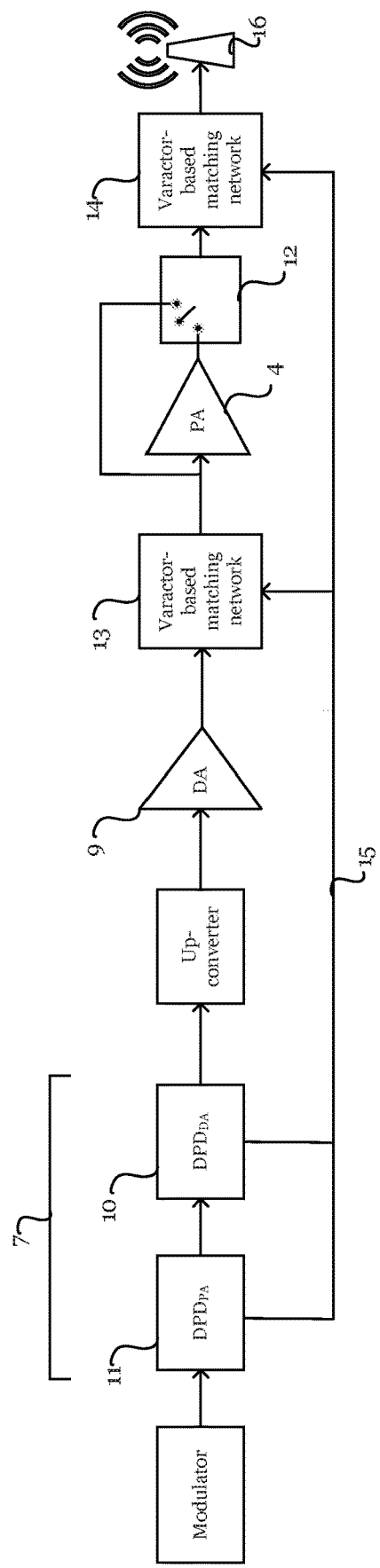
FIG. 11 shows schematically a transmitter in accordance with a first embodiment of the invention.

FIG. 11 illustrates schematically an embodiment of the invention whereby load modulation is used to further increase the efficiency of the system. The figure shows a part of the base station 1 shown in FIG. 10, with some further detail added. In view of the high power requirements of the system, the base PA 4 is driven by a driver amplifier (DA) 9. To address the fact that both the PA 4 and the DA 9 are subject to non-linearity issues near the top of their operating ranges, the digital pre-distortion device 7 comprises first and second digital pre-distorters to, 11, the first pre-distorter to applying pre-distortion to linearize the DA 9 and the second pre-distorter 11 applying pre-distortion to linearize the PA 4. In addition, the system makes use of load modulation to increase the efficiency of the system. The load on the DA 9 is matched to the input impedance of the PA by a matching network 13. Similarly the load on the PA 4 is matched to the impedance of an output antenna 16 by a further matching network 14. Further use of the digital pre-distorters to, 11 is made to compensate for distortion arising due to the use of load modulation.

In this regard, the first and second pre-distorters to, 11 are connected to the respective matching networks 13, 14, wherein signals reflecting the levels of load modulation are passed from the matching networks to the digital pre-distorters to, 11 forming a control feedback loop. A switch 12 can be used to bypass the PA 4 when signals of a low level are required.

The matching networks can be varactor-based, where a control signal is used to vary the output impedance instantaneously, and isolators lot at the output of each amplifier. DPD is applied to compensate for the distortion due to load modulation in the signal path (i.e. DA+PA). This could be achieved by characterizing the PA output (i.e. single DPD block) or by characterizing the DA and PA separately (i.e. two consecutive DPD blocks).

Figure 12:
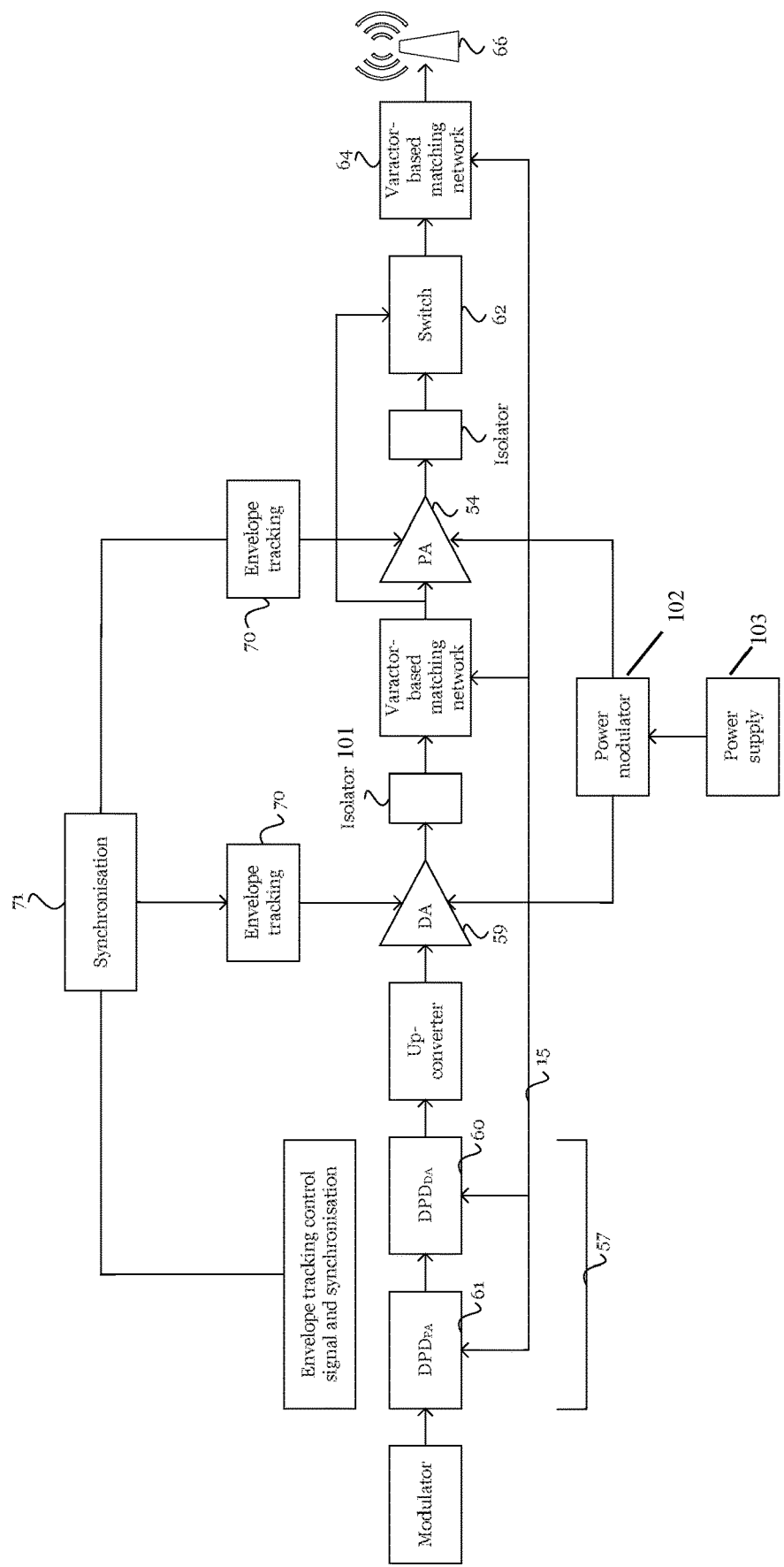
FIG. 12 shows schematically a transmitter in accordance with a second embodiment of the invention.

A further embodiment of the invention is shown in FIG. 12 of the accompanying drawings. In this embodiment, corresponding features to those of FIG. 11 have been indicated with corresponding reference numerals raised by 50.

In this embodiment, both envelope tracking and load modulation are applied to both driver amplifier 59 and power amplifier 54. Although linearising the driver amplifier 59 would result in improved spectral performances (important from thermal management and reliability points of view, especially for high power applications, e.g. 400 Watts upwards, as well as to feed a linear signal to the power amplifier 54), linearising the power amplifier contributes the most towards the overall efficiency. While load modulation could maximise the power transfer to the load by changing the varactor based network impedance, envelope modulating the power amplifier 54 supply at the same time can further improve the power efficiency. This is because it will provide instantaneous DC power to the power amplifier 54 according to the envelope of the baseband signal (shown as "modulator" in FIG. 12).

Efficiency can further be improved by providing the same envelope modulation 70 of the power supply 103 to the driver amplifier 59 as is applied to the power amplifier 54, delayed appropriately (by "synch" stage 71); typically, the envelope modulation of the drive amplifier 59 would need to be slightly ahead of that of the power amplifier 57, but lead or lag will be possible to synchronise the control loops.

The invention claimed is:

1. A transmitter for transmitting a signal, the transmitter comprising:
   a power amplifier;
   a driver amplifier, an output of the driver amplifier being connected to an input of the power amplifier via a first load modulation device operable to match an impedance of the driver amplifier output with an impedance of the power amplifier input;
   a second load modulation device connected to an output of the power amplifier and operable to match an impedance of the power amplifier output with an input impedance of a further device;
   an envelope amplifier for applying envelope tracking to the power amplifier and the driving amplifier; and
   a predistortion device operable to apply predistortion to the signal to compensate for non-linearity of the driver amplifier and the power amplifier and the load modulation devices, wherein the predistortion device comprises at least one of:
      a first predistortion device connected to the second load modulation device and arranged to provide a control signal thereto, and operable to apply predistortion to compensate non-linearity of the power amplifier and the second load modulation device, and
      a second predistortion device connected to the first load modulation device and arranged to provide a control signal thereto, and operable to apply predistortion to compensate non-linearity of the driver amplifier and the first load modulation device.

2. A transmitter according to claim 1, wherein the first load modulation device comprises:
   a matching network having one or more varactors.

3. A transmitter according to claim 1, wherein the second load modulation device comprises:
   a matching network having one or more varactors.

4. A transmitter according to claim 1, in combination with the further device, wherein the further device comprises:
   an antenna.

5. A transmitter according to claim 1, wherein the control signal is a feedforward control signal.

6. A transmitter according to claim 1, wherein the transmitter is disposed in combination with a base station or a relay station.

7. A transmitter according to claim 1, comprising:
   a switch operable to bypass the power amplifier.

8. A transmitter according to claim 1, comprising:
   an isolator at the output of the power amplifier and at an output of the driver amplifier.

9. A transmitter according to claim 1, comprising:
   a power supply for each of the driver amplifier and the power amplifier; and
   a power modulator configured to modulate power supplied to each of the driver amplifier and the power amplifier.

10. A transmitter according to claim 9, wherein:
    the power modulator is configured to modulate power applied to the driver amplifier after a delay has elapsed after the power modulator has modulated power applied to the power amplifier.

11. A signal transmission system comprising:
    a transmitter according to claim 1; and
    a receiver for receiving the transmitted signal.

12. A method of transmitting a signal with a transmitter the transmitter including a power amplifier; a driver amplifier, an output of the driver amplifier being connected to an input of the power amplifier via a first load modulation device operable to match an impedance of the driver amplifier output with an impedance of the power amplifier input; a second load modulation device connected to an output of the power amplifier and operable to match an impedance of the power amplifier output with an input impedance of a further device; and an envelope amplifier for applying envelope tracking to the power amplifier and the driving amplifier; and a predistortion device operable to apply predistortion to the signal to compensate for non-linearity of the driver amplifier and the power amplifier and the load modulation devices, the method comprising:
    applying predistortion to a signal and amplifying the signal using one or more of the power and driver amplifiers, comprising at least one of:
       a first predistortion device connected to the second load modulation device and arranged to provide a control signal thereto, and applying predistortion to compensate non-linearity of the power amplifier and the second load modulation device, and
       a second predistortion device connected to the first load modulation device and is arranged to provide a control signal thereto, and applying predistortion to compensate non-linearity of the driver amplifier and the first load modulation device;
    modulating a load at the output of the or each power and driver amplifier to substantially match an impedance of the load with that of the output; and
    controlling load modulation via the predistortion.

13. A transmitter according to claim 2, in combination with the further device, wherein the further device comprises:
    an antenna.

* * * * *